United States Patent
Wang et al.

(10) Patent No.: US 7,498,641 B2
(45) Date of Patent: Mar. 3, 2009

(54) PARTIAL REPLACEMENT SILICIDE GATE

(75) Inventors: Chih-Hao Wang, Hsin-Chu (TW);
Yen-Ping Wang, Taipei (TW);
Chenming Hu, Alamo, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 127 days.

(21) Appl. No.: 11/117,153

(22) Filed: Apr. 28, 2005

(65) Prior Publication Data

US 2005/0263830 A1   Dec. 1, 2005

Related U.S. Application Data

(60) Provisional application No. 60/575,764, filed on May 28, 2004.

(51) Int. Cl.
*H01L 23/62* (2006.01)
(52) U.S. Cl. ............... 257/388; 257/377; 257/382; 257/384; 257/412
(58) Field of Classification Search ......... 257/348, 257/377, 388, 382
See application file for complete search history.

(56) References Cited

U.S. PATENT DOCUMENTS 5,612,240 A * 3/1997 Chang ............... 438/297
6,100,185 A * 8/2000 Hu .................... 438/642
6,204,103 B1 3/2001 Bai et al.
7,067,379 B2 * 6/2006 Wen et al. ............ 438/300
2002/0036353 A1 * 3/2002 Song et al. ........... 257/774
2002/0053711 A1 * 5/2002 Chau et al. ........... 257/412
2003/0178617 A1 * 9/2003 Appenzeller et al. ..... 257/20
2005/0018380 A1 * 1/2005 Yeo et al. ............ 361/306.1
2005/0074932 A1 * 4/2005 Lin et al. ............. 438/199

OTHER PUBLICATIONS

Kedzierski, J., et al., "Issues in NiSi-Gated FDSOI Device Integration," IEDM, 2003, pp. 441-444.

* cited by examiner

*Primary Examiner*—Minsun Harvey
*Assistant Examiner*—Xnning Niu
(74) *Attorney, Agent, or Firm*—Slater & Matsil, L.L.P.

(57) ABSTRACT

A method of forming fully silicide gates having uniform gate silicide thickness is presented. A gate dielectric is formed over a substrate. A silicon-containing layer is formed over the gate dielectric. A dielectric layer is formed over the silicon-containing layer. A top layer is formed over the dielectric layer. The gate dielectric, the silicon-containing layer, the dielectric layer, and the top layer are patterned into a gate stack. A spacer is formed along an edge of the gate stack. The top layer and the dielectric layer are removed. A metal layer is deposited on the silicon-containing layer and silicided.

16 Claims, 8 Drawing Sheets

PARTIAL REPLACEMENT SILICIDE GATE

This application claims priority to provisional application Ser. No. 60/575,764, filed May 28, 2004, entitled "Partial Replacement Silicide Gate" which application is incorporated herein by reference.

TECHNICAL FIELD

This invention relates generally to semiconductor devices, and more specifically to the formation of CMOS transistors.

BACKGROUND

Modern day metal-oxide-semiconductor field-effect transistors (MOSFET) typically utilize gates made of polysilicon. One disadvantage in utilizing polysilicon gates for MOSFETs is the depletion effect that affects polysilicon gates. At inversion, a polysilicon gate generally experiences depletion of carriers in the area of the polysilicon adjacent to the gate dielectric. The depletion effect reduces the effective gate capacitance of the MOSFET incorporating a polysilicon gate. Ideally, it is desirable that the gate capacitance is high. The higher the gate capacitance, the more charge is accumulated on both sides of the gate capacitor, and therefore more charge is accumulated in the channel. As more charge is accumulated in the channel, the drain-source current becomes higher when the transistor is biased.

Figure 1:
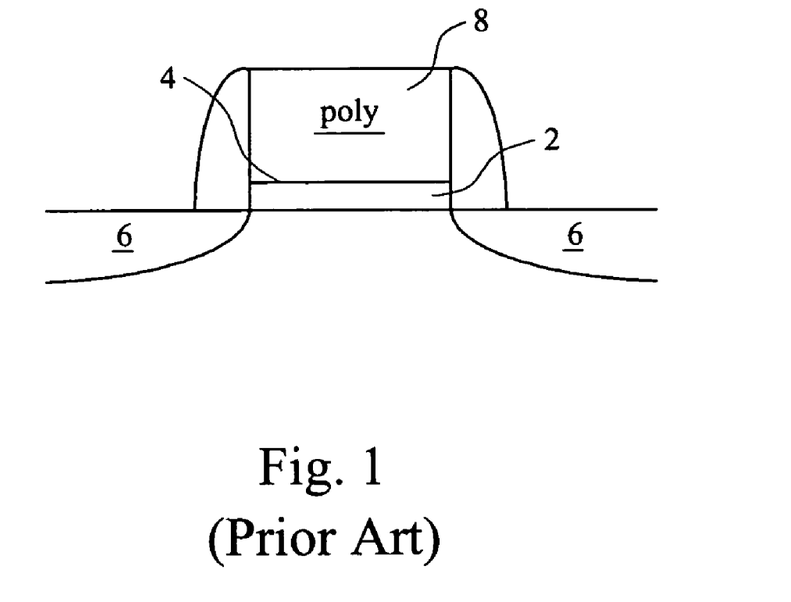
FIG. 1 illustrates a conventional polysilicon gate transistor.

FIG. 1 illustrates, in simplified form, a cross-sectional view of a MOSFET that has a polysilicon gate electrode 8. Due to the polysilicon material of gate electrode 8, the depletion effect causes charged carriers to accumulate near interface 4 between gate electrode 8 and the gate dielectric 2. Accordingly, the effective gate capacitance decreases. This is due to an increase in the effective distance between the charges accumulated on both sides of the gate dielectric 2. The effective distance that separates the charge on both sides of gate dielectric 2 becomes larger due to the depletion of charge, in the polysilicon gate 8, in the vicinity of interface 4. Accordingly, polysilicon gate electrode 8 causes the effective gate capacitance to decrease.

Figure 2:
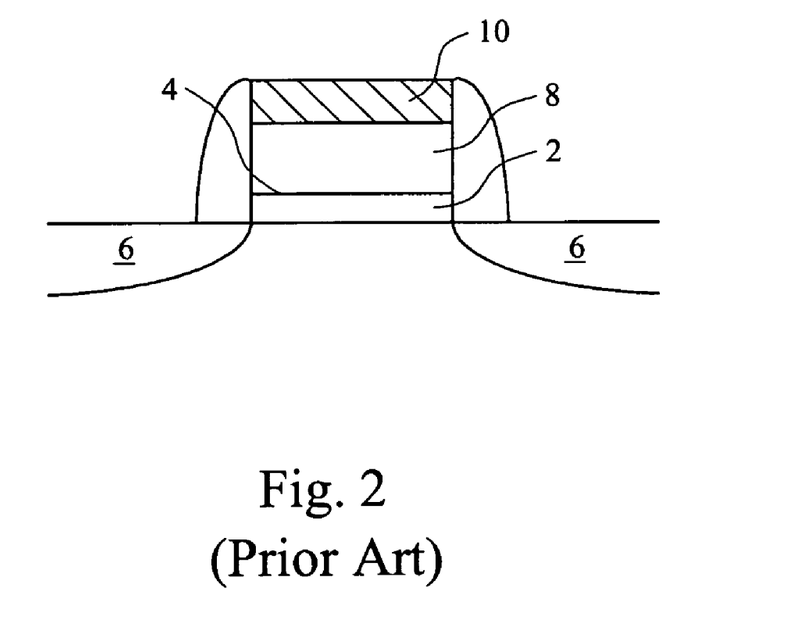
FIG. 2 illustrates a conventional transistor with a partially silicided gate.

Silicide metal gates have been proposed as a promising replacement for polysilicon gates for MOS transistors. FIG. 2 illustrates a cross-sectional view of a MOSFET with a silicided polysilicon gate. The gate has a layer of silicide 10 with an underlying layer of polysilicon 8. Polysilicon 8 typically exists because of under silicidation. While silicide 10 may help decrease the resistance of the gate, charge is still depleted in the vicinity of interface 4 between polysilicon 8 and gate oxide 2, thereby causing a smaller effective gate capacitance.

Fully silicide gates were developed to solve the above-mentioned problem. Like pure metals, fully silicided gates eliminate the gate-depletion effect. Fully silicided gates are formed by a two-step process. First, silicide is formed in the source/drain region, and the hard-mask prevents silicide formation on gate. After a liner oxide or nitride deposition, the gate is subject to a CMP process to expose the gate polysilicon. A second silicide is formed on gate resulting in silicide metal gate.

Figure 3:
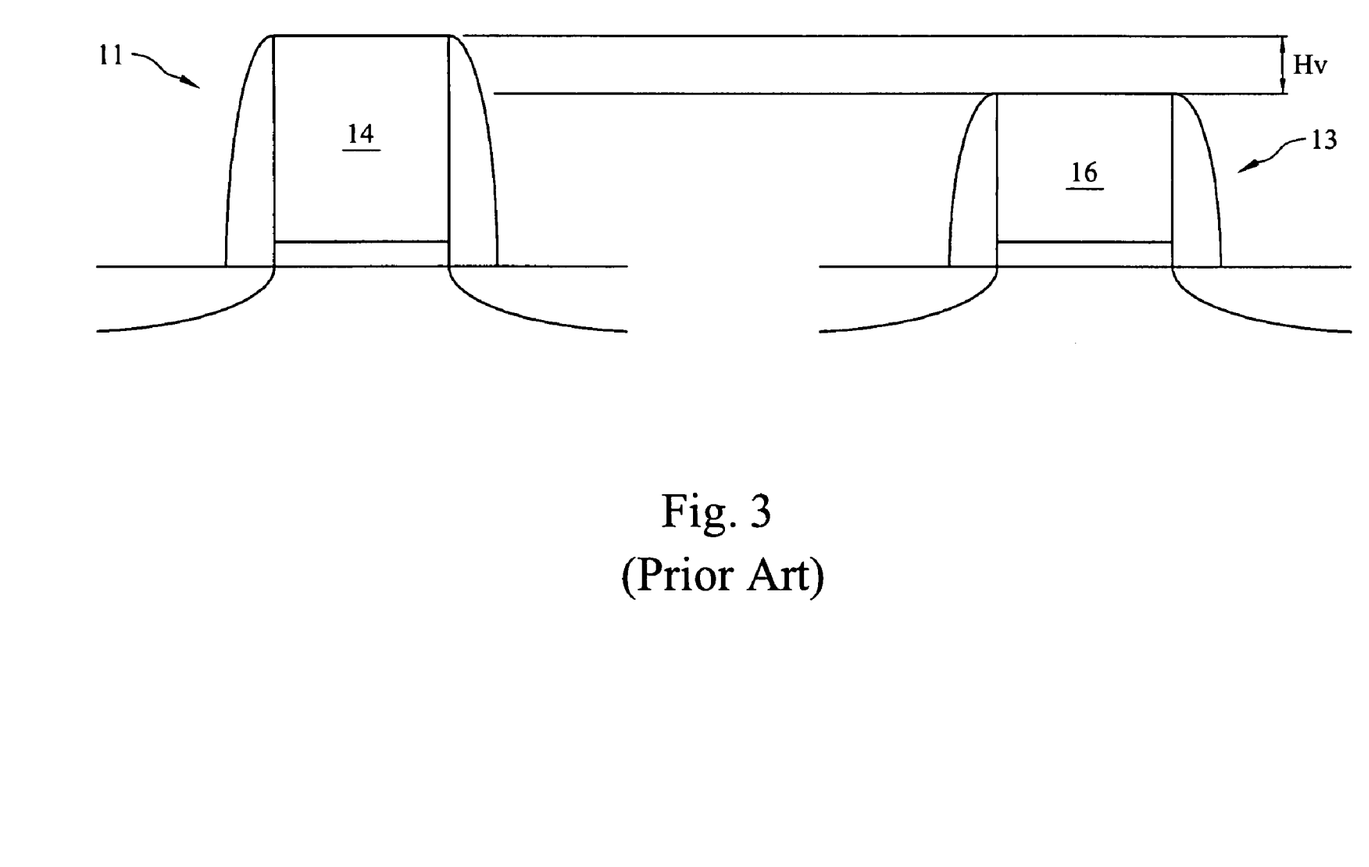
FIG. 3 illustrates an example of the gate thickness variation.

The conventional formation process of metal silicide gates has some disadvantages. Incomplete gate silicidation and variations in the gate silicide phase are serious challenges. Non-uniform silicidation will impact on device work function, threshold voltage, equivalent oxide thickness, gate leakage, and gate resistance. FIG. 3 illustrates an example of the silicidation variation. MOS transistors 11 and 13 are formed in separated regions having different device density. Due to CMP variations, the thickness of the gate electrodes 14 and 16 are different. During the silicide, the thick difference $H_v$ causes either over silicidation or under silicidation. A small device may be silicided fully, but a large device based on the same condition may not. The gate difference may also come from nMOS and pMOS. For example, using the same process, an nMOS gate has a thickness of about 210 Å, and a pMOS has a thickness of about 530 Å. The thickness difference comes from the different poly doping type. This poly thickness difference is too high for the silicidation process applied to nMOS and pMOS at the same time. Another silicidation variation occurs at wafer level. After poly gate etch back, there may be about 100 Å poly height difference between devices at the wafer center and wafer edge.

Besides the silicidation variations, the traditional two-step fully silicided gate process is complicated, increasing cost and decreasing yield. Therefore, new method for forming fully silicided gates is needed.

SUMMARY OF THE INVENTION

The preferred embodiment of the present invention presents a method of forming a fully silicided gate of a CMOS transistor.

In accordance with one aspect of the present invention, a method of forming a silicide metal gates having uniform silicide thickness is presented. A gate dielectric is formed over a substrate. A silicon-containing layer is formed over the gate dielectric. A dielectric layer is formed over the silicon-containing layer. A top layer is formed over the dielectric layer. The gate dielectric, the silicon-containing layer, the dielectric layer, and the top layer are patterned into a gate stack. A spacer is formed along an edge of the gate stack. The top layer and the dielectric layer are removed. A metal layer is deposited on the silicon-containing layer and silicided. After the formation of the gate, the top surface of the resulting gate electrode is lower than the top edge of the spacer.

By using the preferred embodiment of the present invention, the thickness of the gate silicide is substantially uniform whether the transistor is an nMOS or a pMOS transistor, in a dense region or a less dense region, at the center of a wafer or at an edge of the wafer. The gate silicidation process can thus be better controlled.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 4:
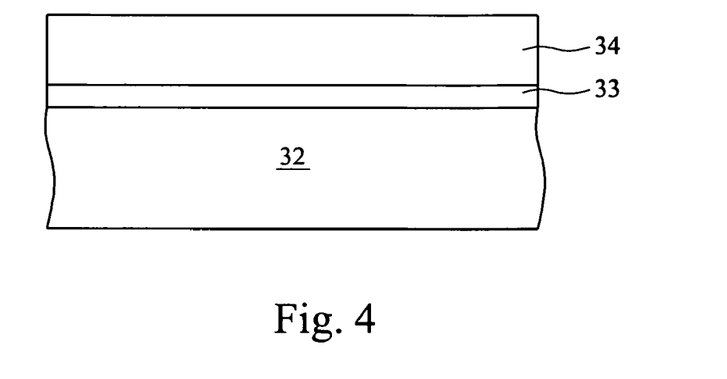
FIGS. 4 through 16 illustrate intermediate stages of forming a preferred embodiment of the present invention having a fully silicided-gate structure.

The intermediate stages of a preferred embodiment of the present invention are illustrated in FIGS. 4 through 16. In FIG. 4, substrate 32 is preferably a semiconductor. More preferably, substrate 32 is formed of silicon, either a bulk silicon wafer or a layer of silicon formed on an insulating layer such as the well-known silicon-on-insulator (SOI) structure. Substrate 32 may also be formed of other semiconductor or insulator materials such as strained silicon, strained SOI, silicon-germanium, strained silicon germanium, silicon-germanium on insulator, strained silicon-germanium on insulator, Ge, strained-Ge, germanium-on-insulator (GeOI), strained GeOI, strained semiconductor, compound semiconductor, and multi-layers semiconductor.

A gate dielectric layer 33 is formed on the substrate 32. In one embodiment, gate dielectric 33 comprises materials having dielectric values (k value) greater than about 9, such as oxide, oxy-nitride, oxygen containing dielectric, nitrogen containing dielectric, and combinations and multi-layers thereof. In other embodiments, it comprises materials having k values greater than about 9, such as $HFO_2$, $HFSiO_x$, HFSiON, $ZrO_2$, $Al_2O_3$, $TiO_2$, $Ta_2O_5$, $La_2O_3$, $CeO_2$, $Bi_4Si_2O_{12}$, $WO_3$, $Y_2O_3$, $LaAlO_3$, $Ba_{1-x}Sr_xTiO_3$ (x less than 1), $PbTiO_3$, $BaTiO_3$, $SrTiO_3$, $PbZrO_3$, PST, PZN, PZT, PMN, metal-oxide, metal-silicate, metal-nitride, transition metal-oxide, transition metal-silicate, transition metal-nitride, and combinations and multi-layers thereof A layer 34 is deposited on the dielectric 33. In the preferred embodiment, layer 34 is a polysilicon layer. In alternative embodiments, layer 34 contains at least one layer of silicon-containing material and other underlying layer or layers. The silicon-containing layer resides at the top of the layer 34 and is preferably a polysilicon, but also can be amorphous silicon. The layers underlying the silicon-containing material can be a material comprising oxide, oxynitride, silicon nitride or their combinations. For illustration purposes, layer 34 will be referred as polysilicon 34 although it may be a composite layer. Polysilicon 34 has a preferred thickness of about 50 Å to about 1500 Å, more preferably about 100 Å to about 400 Å.

Figure 5:
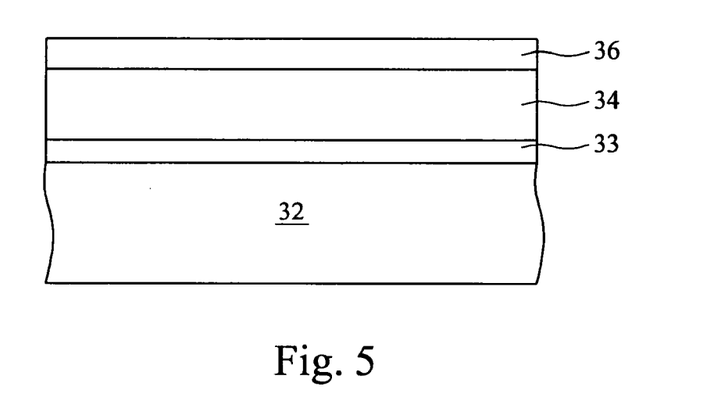

FIG. 5 illustrates a gate etch stop layer (GESL) 36 formed on polysilicon 34. In the preferred embodiment, GESL 36 is an oxide. In other embodiments, it is a dielectric comprising polysilicon, SiON, SiN and combinations thereof. The thickness is preferably between about 10 Å to about 100 Å, more preferably about 30 Å to about 60 Å. The GESL 36 is used as an etching stop layer in subsequent steps to prevent the underlying polysilicon 34 from being etched. GESL 36 can be formed using methods such as local oxidation or other known methods.

Figure 6:
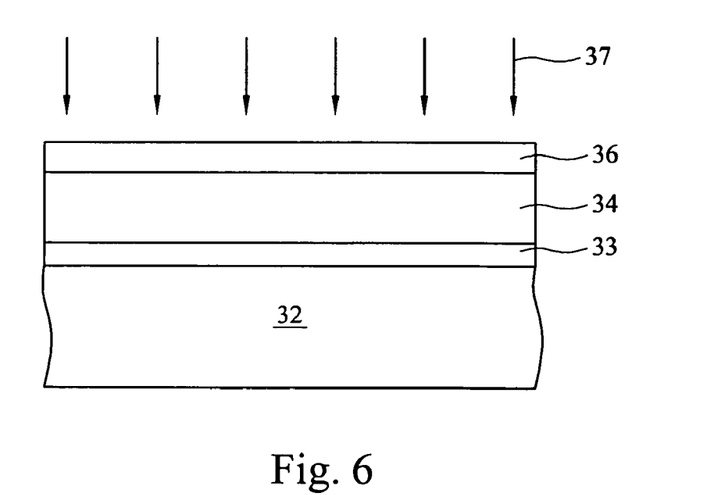

GESL 36 and polysilicon 34 are then pre-doped, which is symbolized as arrows 37 in FIG. 6. The dopant depends on the type of MOS transistors to be formed. For nMOS, the dopant can be antimony, arsenic, or phosphorous. For PMOS, the dopant can be boron, indium, or aluminum. The doping concentration is preferably about $1E15 \text{ cm}^{-2}$ to about $9E17 \text{ cm}^{-2}$. Doping polysilicon 34 ensures that both nMOS and pMOS have correct work functions when fully silicided.

Figure 7:
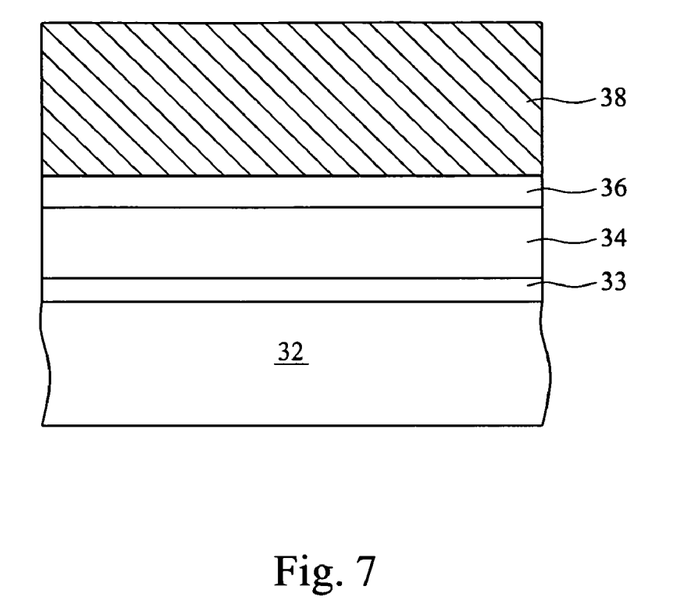

FIG. 7 illustrates a top layer 38 deposited on the GESL layer 36. In the preferred embodiment, top layer 38 is a polysilicon and will be referred to as top layer 38. In other embodiments, it can be a dielectric layer. However, it will be a different material from the underlying GESL 36 so that a selective etching can be performed to the top layer 38 and stop at GESL 36. The top layer 38 has a preferred thickness of about 100 Å to about 1200 Å, more preferably about 500 Å to about 1000 Å.

Figure 8:
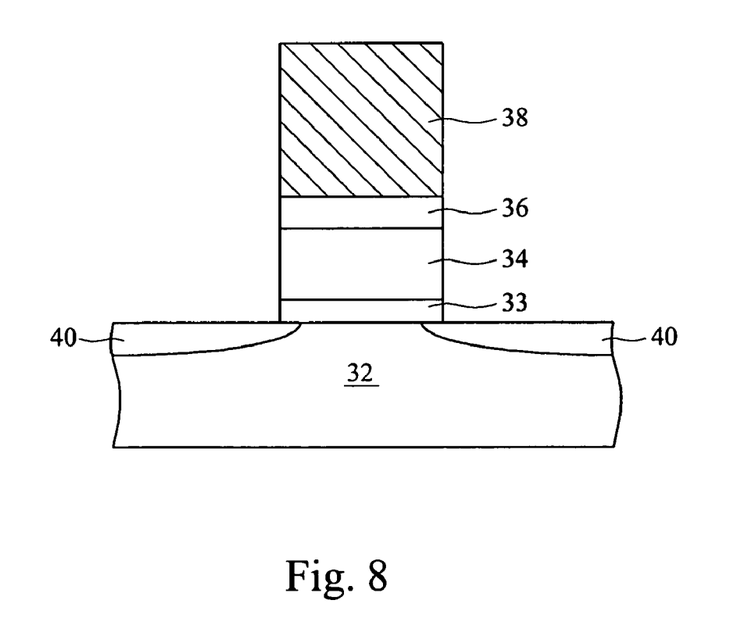

The stacked structure formed in previous steps, including the top layer 38, GESL 36, polysilicon-containing layer 34 and gate dielectric 33 is then patterned and etched as shown in FIG. 8 into a gate stack. An implantation can be optionally performed to form lightly doped source/drain (LDD) regions 40.

Figure 9:
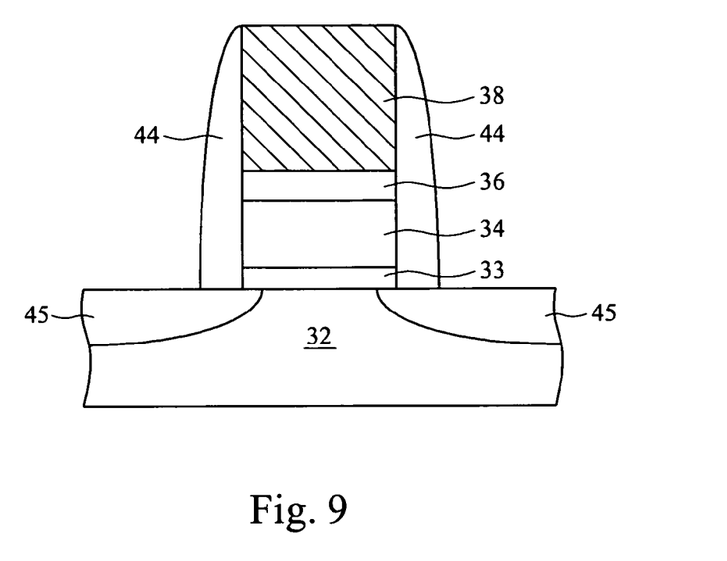

FIG. 9 illustrates a pair of spacers 44 formed along the sidewalls of the gate stack comprising regions 33, 34, 36 and 38. Spacers 44 serve as self-aligning masks for subsequent source/drain formation steps, as described below. The spacers may be formed by well-known methods such as blanket depositing a dielectric layer over the entire region including substrate 32 and top layer 38, then anisotropically etching to remove the dielectric from the horizontal surfaces and leaving spacers 44. Spacers 44 can be oxide, oxy-nitride, nitride or combinations and multi-layers. They preferably have a width of less than about 600 Å. It is noted that the materials of the spacers 44 is different from that of top poly 38 so that selective etching can be conducted.

In the preferred embodiment, source and drain regions 45 are formed by implanting the desired dopant into substrate 32. In other embodiments, the source and drain regions 45 can be formed by forming recesses in substrate 32, and epitaxially growing semiconductor materials in recesses. The methods of forming source and drain regions 45 are well known in the art.

Figure 10:
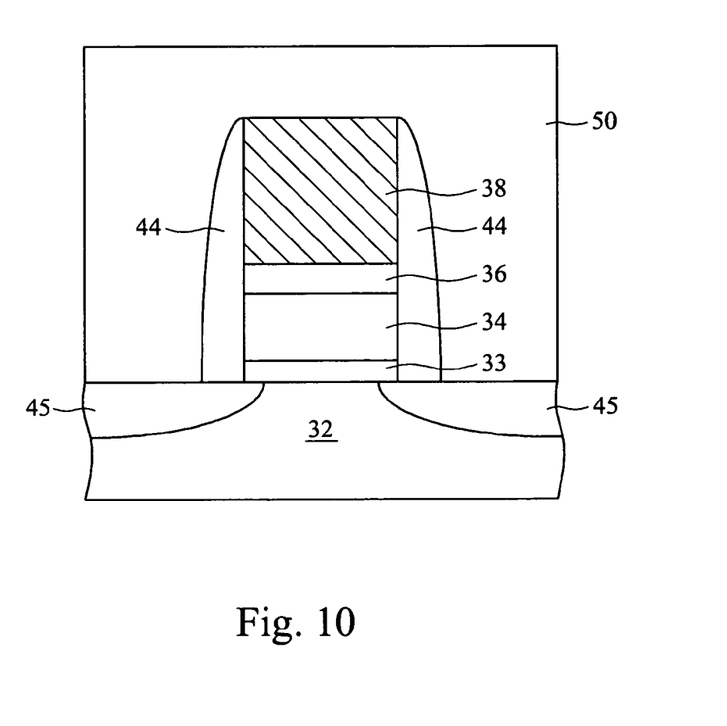
Figure 11:
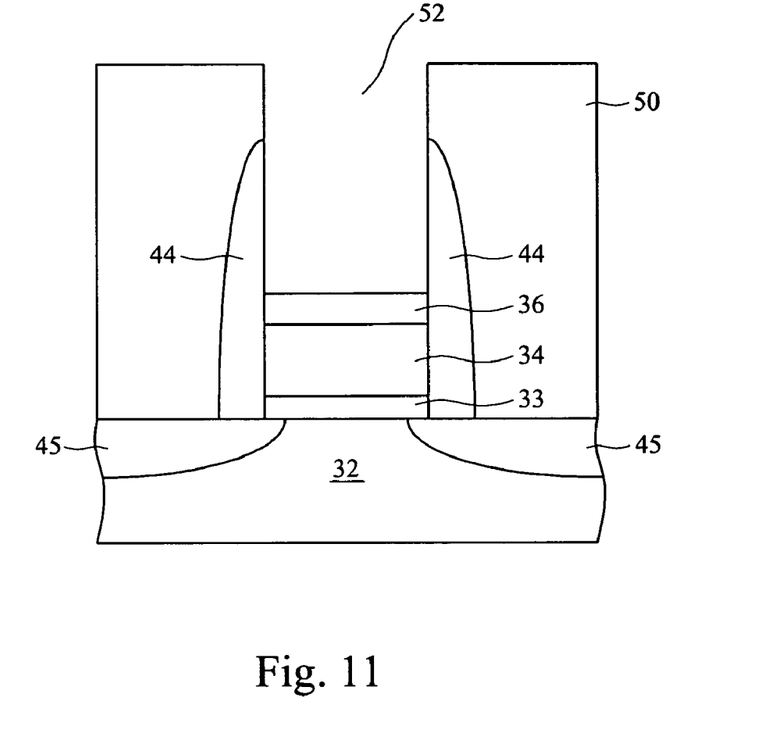
Figure 12:
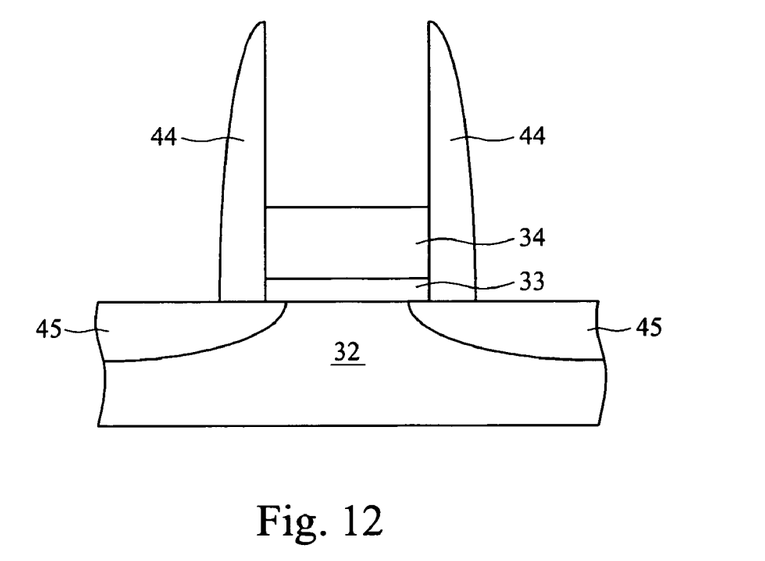

FIG. 10 illustrates a photo resist 50 on the formed structure. Photo resist 50 is masked and developed to expose the top layer 38, as shown in FIG. 11. The top layer 38 is removed through selective etching. Since gate spacers 44 have a material different from that of top poly 38, lateral etching of the spacers is prevented. GESL 36 protects the underlying layer 34 from being etched. Photo resist 50 is then completely removed. GESL 36 is selectively etched as shown in FIG. 12, exposing the surface of the polysilicon-containing layer 34. In other embodiments, GESL 36 may be etched away before removing photo resist 50.

Figure 13:
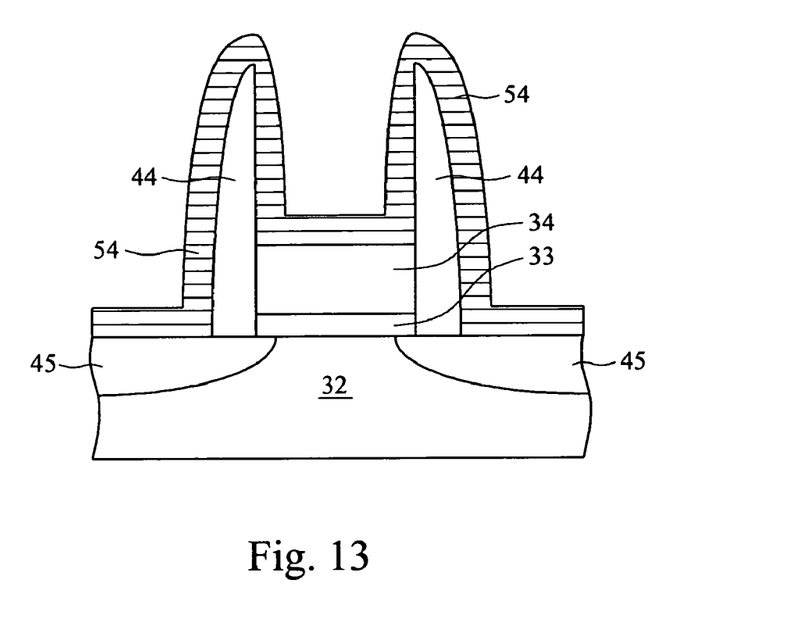
Figure 14:
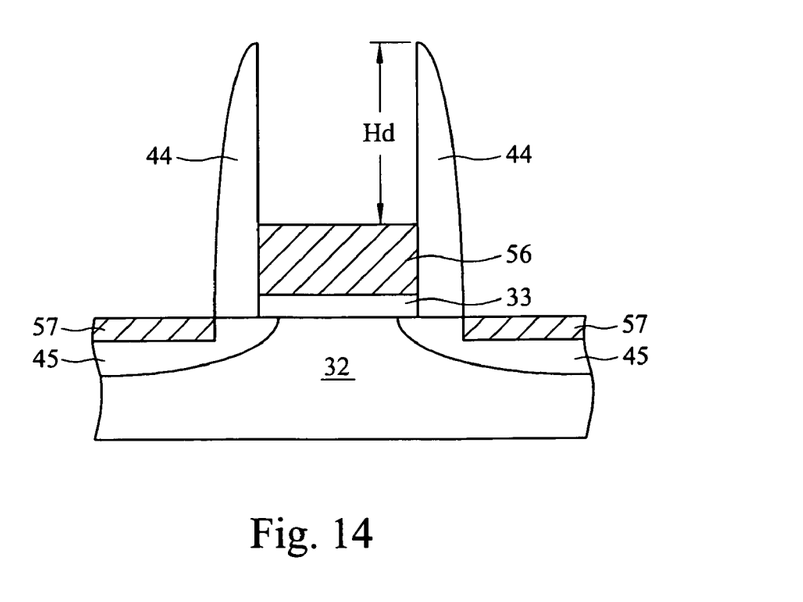

FIG. 13 illustrates a metal 54 blanket deposited covering the layer 34, spacers 44 and source and drain regions 45. Metal 54 is preferably a transitional metal, such as cobalt, titanium, nickel, tungsten, platinum, zirconium, or the like. Metal 54 can be deposited by chemical vapor deposition (CVD), sputter deposition, or physical vapor deposition (PVD), but other CVD methods, such as atomic layer chemical vapor deposition (ALCVD), metal organic chemical vapor deposition (MOCVD), and plasma enhanced chemical vapor deposition (PECVD) may also be used. The device is then heated, which causes the metal 54 to react with the underlying polysilicon-containing layer 34 and form a silicide 56, as shown in FIG. 14. The process is controlled so that the silicide 56 reaches to the bottom of the polysilicon-containing layer 34 and no over silicidation occurs. Since the thickness of the polysilicon-containing layer 34 is uniform throughout a wafer, it is guaranteed that the formed silicide 56 is uniform across the wafer. The un-reacted metal is selectively removed through the use of an etchant that does not attack the silicide 56, spacers 44 and silicon substrate 32, as is well known in the art. The remaining part forms a silicide 56. Silicides 57 are also formed in source and drain regions at the same time.

Due to the removal of the top poly 38 and GESL 36, a height difference $H_d$, which is shown in FIG. 14, is created between silicide 56 and spacers 44. The height difference $H_d$ is preferably greater than about 200 Å. It is preferred that the height of the silicide 56 formed is lower than about 700 Å and more preferably lower than about 500 Å. It is also preferred that the height of the silicide 56 is between about 5 percent and about 90 percent of the height of the spacers 44. More preferably, the height of the silicide 56 is between about 10 and about 35 percent of the height of the spacers 44.

Figure 15:
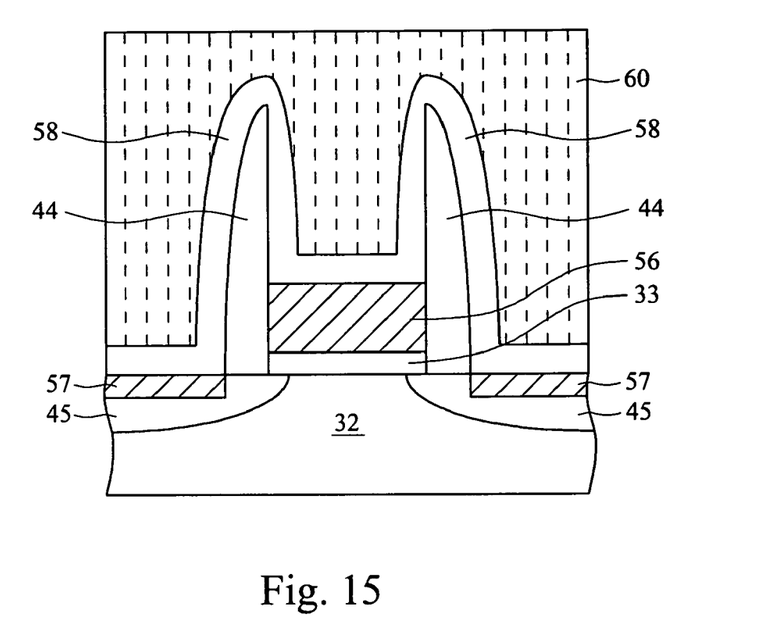

A contact etching stop layer (CESL) 58 is then formed covering the silicide 56, gate spacers 44 and silicide 57 as illustrated in FIG. 15. It acts as an etch stop layer to protect underlying regions from being etched during the subsequent process steps forming electrical contacts to the source/rain regions and gate electrode 56.

Figure 16:
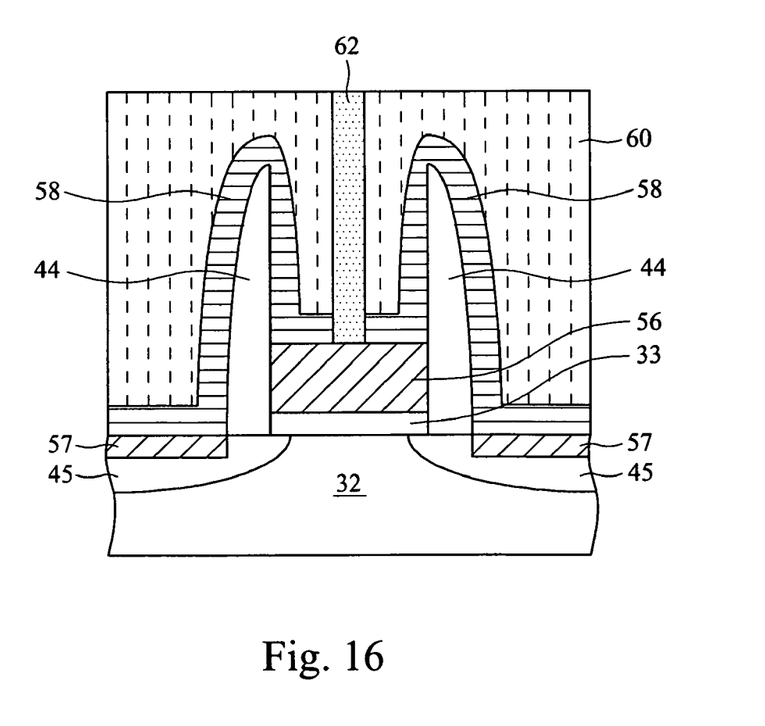

Also illustrated in FIG. 15 is an inter-level dielectric (ILD) 60, also sometimes known as a pre-metal dielectric (PMD) or an inter-metal dielectric (IMD) layer deposited over the surface of the CESL 58. The ILD layer 60 is preferably a phospho-silicate glass (PSG) or other known dielectrics. This ILD layer 60 provides insulation between the transistor and overlying metal lines. FIG. 16 illustrates the device after the formation of contact 62 in the ILD dielectric layer 60. A photo-resist material (not shown) may be formed and patterned over the ILD layer 60 in order to form contact opening 62 to gate silicide 56. Note that CESL 58 operates as an etch stop layer during the etching of ILD dielectric layer 60 and thus protects the underlying silicide 56. Next, the exposed CESL 58 in the contact openings are etched, preferably using reactive ion etching (RIE). Because CESL 58 is quite thin relative to ILD dielectric layer 60, process control and endpoint detection are more closely controlled, thus limiting the likelihood of over-etching through the underlying silicide layer 56. At the same time contact 62 is formed, contacts to source and drain regions can also be formed (not shown).

By using the preferred embodiment of the present invention, the thickness of the silicide 56 is uniform across the device. The thickness of silicide layer is also substantially equal on the gates of different MOS transistors across the chip. To guarantee the formation of substantially uniform silicides 56 across the chip, it's desired the thickness of poly layer 34 is low and uniform prior to the formation of the silicide 56. The formation and remove of layers 36 and 38 creates a thin layer 34 with uniform thickness. This in turn ensures that the silicide thickness difference between transistors of a pMOS or an nMOS, in a isolated area or a dense area, at wafer center or at wafer edge, and in a large pattern or a small pattern are all low and preferably less than about 80 Å, more preferably less than about 30 Å.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit comprising:
    a plurality of first transistors;
    a plurality of second transistors;
    wherein each of the respective first transistors and second transistors has a gate comprising a substantially fully silicided gate electrode having a top surface, a gate dielectric and a spacer having a top edge;
    wherein the gate electrode of each of the respective first and second transistors has a thickness substantially smaller than a height of the respective spacer, wherein a height of the gate electrode is about 10% to about 35% of the height of the respective spacer; and
    wherein the thickness of the respective gate electrode of the first transistor and the thickness of the respective gate electrode of the second transistor is substantially the same.

2. The integrated circuit of claim 1 wherein a substrate of the integrated circuit comprises a material selected from the group consisting essentially of silicon-on-insulator (SOI), Silicon-Germanium-on-Insulator, germanium-on-insulator (GeOI), strained semiconductor, and combinations and multi-layers thereof.

3. The integrated circuit of claim 1 wherein the gate dielectric comprises a material having a k value of greater than about 9.

4. The integrated circuit of claim 1 wherein the gate electrode has a height of lower than about 700 Å.

5. The integrated circuit of claim 1 wherein the spacer has a width of less than about 600 Å.

6. The integrated circuit of claim 1 wherein the thickness of the gate electrode of any of the first transistors and the thickness of the gate electrode of any of the second transistors have a difference of smaller than about 80 Å.

7. The integrated circuit of claim 6 wherein the first transistors are nMOS transistors and the second transistors are pMOS transistors.

8. The integrated circuit of claim 6, wherein the first transistors further comprise a dopant selected from the group consisting essentially of antimony, arsenic, and phosphorous.

9. The integrated circuit of claim 6, wherein the first transistors further comprise a dopant selected from the group consisting essentially of boron, indium, and aluminum.

10. The integrated circuit of claim 6 wherein the first transistors are in a dense area of transistors and the second transistors are in a less dense area of transistors.

11. The integrated circuit of claim 1 further comprising a contact etch stop layer (CESL) over the plurality of first transistors and the plurality of second transistors, wherein portions of the CESL directly over gate electrodes of the plurality of first transistors and the plurality of second transistors have top surfaces lower than top edges of the respective spacers.

12. The integrated circuit of claim 1 wherein each of the gate electrodes of the plurality of first transistors and the plurality of second transistors is fully silicided.

13. A semiconductor structure comprising:
    a semiconductor substrate;
    a gate dielectric on the semiconductor substrate;
    a fully silicided gate electrode on the gate dielectric; and
    a gate spacer on a sidewall of the fully silicided gate electrode, wherein the gate spacer has a top edge substantially higher than a top surface of the fully silicided gate electrode, wherein a height of the fully silicided gate electrode is about 10% to about 35% of a height of the gate spacer.

14. The semiconductor structure of claim 13 further comprising a contact etch stop layer (CESL) over the fully silicided gate electrode and the gate spacer, wherein the (CESL) comprises a portion directly over the fully silicided gate electrode, and wherein a top surface of the portion is lower than the top edge of the gate spacer.

15. The semiconductor structure of claim 13, wherein the top edge of the gate spacer and the top surface of the fully silicided gate electrode have a vertical distance of greater than about 500 Å.

16. The semiconductor structure of claim 15 wherein the vertical distance is greater than about 1000 Å.

* * * * *